(12) United States Patent
Caldwell et al.

(10) Patent No.: US 7,915,143 B2
(45) Date of Patent: Mar. 29, 2011

(54) METHOD OF MEDIATING FORWARD VOLTAGE DRIFT IN A SIC DEVICE

(75) Inventors: Joshua D. Caldwell, Accokeek, MD (US); Robert E Stahlbush, Silver Spring, MD (US); Karl D Hobart, Upper Marlboro, MD (US); Marko J Tadjer, Greenbelt, MD (US); Orest J Glembocki, Alexandria, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 120 days.

(21) Appl. No.: 12/433,009

(22) Filed: Apr. 30, 2009

(65) Prior Publication Data
US 2009/0273390 A1     Nov. 5, 2009

Related U.S. Application Data

(60) Provisional application No. 61/049,008, filed on Apr. 30, 2008.

(51) Int. Cl.
*H01L 21/326* (2006.01)
*H01L 21/479* (2006.01)
(52) U.S. Cl. ....................... 438/466; 438/931
(58) Field of Classification Search .................. 438/466, 438/931
See application file for complete search history.

(56) References Cited

U.S. PATENT DOCUMENTS

7,427,326 B2 * 9/2008 Sumakeris et al. .............. 117/89
* cited by examiner

*Primary Examiner* — Scott B Geyer
*Assistant Examiner* — Seahvosh J Nikmanesh
(74) *Attorney, Agent, or Firm* — Amy L. Ressing; Suresh Koshy (57) ABSTRACT

A method of reversing Shockley stacking fault expansion includes providing a bipolar or a unipolar SiC device exhibiting forward voltage drift caused by Shockley stacking fault nucleation and expansion. The SiC device is heated to a temperature above 150° C. A current is passed via forward bias operation through the SiC device sufficient to induce at least a partial recovery of the forward bias drift.

7 Claims, 6 Drawing Sheets

METHOD OF MEDIATING FORWARD VOLTAGE DRIFT IN A SIC DEVICE

CROSS-REFERENCE TO RELATED APPLICATION

This application claims priority to U.S. Provisional Patent Application Ser. No. 61/049,008 filed on Apr. 30, 2008, entitled "TEMPERATURE-MEDIATED FORWARD VOLTAGE DRIFT AND RECOVERY IN HEXAGONEAL SILICON CARBIDE BIPOLAR AND UNIPOLAR DEVICES," to Caldwell et al.

TECHNICAL FIELD

This invention relates generally to a method of mediating forward voltage drift in a SiC device, and, more particularly, to a method of at least partially recovering and/or inhibiting the forward voltage drift that occurs during typical forward bias operation of the SiC device.

BACKGROUND ART

Silicon carbide is a desirable material for high power and temperature bipolar and unipolar electronic devices, such as high blocking voltage PIN and Schottky diodes, respectively. Other such devices include, but are not limited to, junction barrier Schottky diodes ("JBS"), merged-PIN-Schottky diodes ("MPS"), double-diffused metal-oxide-semiconductor field effect transistors ("DMOSFETS"), vertical junction field effect transistors ("VJFETs"), bipolar junction transistors ("BJTs") and insulated-gate bipolar transistors ("IGBTs"). However, the presence of basal plane dislocations ("BPDs") in the drift layer of bipolar or unipolar devices, where bipolar injection may occur, leads to the creation of Shockley stacking faults ("SSFs") when electron-hole pairs ("ehps") are injected via either electrical bias or optical excitation. The SSFs are 3C—SiC (cubic) in structure and act as 'structure-only' quantum wells within the larger bandgap 4H—SiC (hexagonal) lattice. Continued ehp injection during forward bias or optical excitation causes these SSFs to continue to expand throughout the drift layer, which in turn induces an increase in the forward voltage drop ($V_f$). Furthermore, SSFs have been found to be the cause for the observed increase in the specific on-state resistance of SiC high-power depletion-mode DMOSFETS.

Recent experiments by the Applicants and Miyanagi et al., illustrated that expanded SSFs within PIN diodes and n⁻ epitaxial layers, respectively, were contracted back to the original BPDs from which they nucleated via annealing in nitrogen gas at temperatures between 300-700° C. in the absence of an applied current. Miyanagi et al., Annealing Effects on Single Shockley Faults in 4H—SiC, Applied Physics Letters 89, 062104 (2006) is incorporated herein by reference. These and other disproving studies by the Applicants and Miyanagi et al. provide evidence for a driving-force model reported by the Applicants that explains the mechanism, energetics and kinetics associated with SSF expansion and contraction. Other studies have reported observing the shrinking of SSFs under very low electrical injection conditions. While these measurements clearly renewed the important questions concerning the driving force for SSF propagation, it was unclear at the time whether the annealing causes an associated recovery of the drift in $V_f$ and whether there is any lasting damage resulting from subsequent stresses and anneals, and what the correlations between the SSF propagation and the $V_f$ drift are.

DISCLOSURE OF THE INVENTION

An embodiment of the invention, for example, includes a method of reversing Shockley stacking fault expansion. The method comprises providing a bipolar or a unipolar SiC device exhibiting SSFs expanded by forward bias operation. The SiC device is heated to a temperature above 150° C. A forward bias current is passed via forward bias operation through the SiC device sufficient to induce at least a partial recovery of the forward bias drift.

Optionally, the SiC device comprises a hexagonal SiC bipolar device or a hexagonal SiC unipolar device, wherein bipolar injection occurs during operation thereof. Optionally, the SiC device comprises a PIN diode, bipolar junction transistor, a merged-PIN-Schottky diode, a vertical junction field effect transistor, a vertical diffused metal-oxide-semiconductor field-effect transistor, or an insulated gate bipolar transistor.

Optionally, the forward bias current during the recovery stage at temperatures in excess of 150° C. is between 1 and 24 mA/cm². Smaller currents typically do not provide sufficient recovery rates to be useful, whereas currents in excess of 24 mA/cm² tend not to induce sufficient recovery to be of use.

Optionally, the method further comprises operating the SiC device at an on-state voltage and turning the device off at a positive, off-state voltage, the off-state voltage being lower than the on-state voltage, such that the 'off-state' comprises a current density within the limits stipulated above.

Optionally, the SiC device is operationally located in a circuit as part of a removable and replaceable module, wherein the method further comprises removing the SiC device from the circuit, and reinstalling the SiC device in the circuit after the at least partial recovery of the forward bias drift, for example, via either an annealing procedure in the absence of a forward bias or the recovery procedure illustrate above in the presence of a current density of 1 to 24 mA/cm² at temperatures in excess of 150° C.

Another embodiment of the invention comprises, for example, a method of inhibiting SSF expansion. The method comprises operating one of a bipolar or a unipolar SiC device such that an on-state is significantly shorter than an off-state for the SiC device, typically with a duty cycle below 10%. (The duty cycle is the ratio of the on-state time to total cycle time). The SiC device is operated at a temperature above 100° C. For instance, two modes of operation are optionally used. The first mode of operation involves the continuous operation at high temperature, with the temperature alone inhibiting SSF expansion with an off-state with no forward bias current present. The second mode of operation combines operation as in the first mode with passage of a forward bias current through the SiC device in the off-state sufficient to inhibit forward bias drift, thereby maintaining the SiC device within an operational performance specification thereof.

There are several advantages to one or more embodiments of the invention. First, the operation of the devices at elevated temperatures reduces the impact of SSFs upon the devices and minimizes the expansion of the SSFs and the corresponding $V_f$ drift degradation rate and magnitude. This would allow devices that would otherwise be unacceptable for room temperature operation due to high BPD densities to become commercially viable for applications in high ambient temperature environments.

Current-induced induced recovery, the procedure of recovering the $V_f$ drift via SSF contraction under forward bias operation within the above mentioned current and temperature specifications, for example, allows for the regeneration of electrically degraded hexagonal-SiC devices. This enables refurbishment of circuits and/or devices for further use, extending the operational lifetime of the devices, despite some level of SSF-induced electrical degradation having previously occurred. Furthermore, current-induced recovery within a circuit can be induced more readily and often, maintaining the devices within a given voltage tolerance for the turn-on voltage. Current-induced recovery would enable a continued device operation within a circuit without having to be regenerated or replaced for a significantly extended operational lifetime.

In an illustrative embodiment of the invention, the circuitry having a SiC device is exposed to an ambient temperature >150° C. for many applications. Under these conditions, no additional efforts are required, or desired, to cool the SiC devices. When operated, the elevated temperatures would significantly hinder SSF expansion and minimize the $V_f$ drift as well as minimize the impact of the SSFs that did nucleate and expand. When the device is not being forward or reversed biased, a lower, base current could be maintained in the device at this temperature, inducing contraction of any expanded SSFs and recovery of any $V_f$ drift induced. In other words, the device could be operated in TTL-like conditions, where the on-state would be at a given high voltage level desired, and the off-state would be at some lower, but non-zero voltage. Finally, if deemed necessary, the circuit could be temporarily removed and replaced to get a complete regeneration external to the electrical system, after such refurbishment could be reinstalled when necessary.

BRIEF DESCRIPTION OF THE DRAWINGS

FIGS. 6(*a*)-(*f*) are schematic energy diagrams describing the current-induced recovery phenomenon discussed in this patent application.

BEST MODES OF CARRYING OUT THE INVENTION

An embodiment of the invention, for example, includes a method of reversing Shockley stacking fault expansion, which in turn leads to a recovery of degradation to the electrical properties of the device ($V_f$ drift, increases in drift layer resistance, reduction in majority carrier conduction current and/or increases in leakage current in reverse blocking mode). The method comprises providing a bipolar or a unipolar SiC device exhibiting a degradation in the electrical properties caused by forward bias bipolar injection that leads to Shockley stacking fault expansion. The SiC device is heated to a temperature above 150° C. and below the maximum operational temperature of the SiC device and packaging. Operation of SiC for recovery procedures is, for example, performed up to temperatures of approximately 700° C., provided that the electrical packaging of the device and contact integrity are not compromised. A forward bias current is passed through the SiC device sufficient to induce at least a partial recovery of the forward bias drift.

For example, the SiC device is a hexagonal SiC bipolar device or a hexagonal SiC unipolar device, wherein bipolar injection may occur during operation thereof. For example, the SiC device is a PIN diode, bipolar junction transistor, junction barrier Schottky diode, a merged-PIN-Schottky diode, a vertical junction field effect transistor, a vertical double-diffused metal-oxide-semiconductor field-effect transistor, or an insulated gate bipolar transistor.

For example, the forward bias current is between 1 and 24 mA/cm$^2$.

Optionally, the method further comprises operating the SiC device at an on-state voltage, turning the SiC device off at a positive, 'off-state' voltage, with the off-state voltage being lower than the on-state voltage, and returning to operation of the SiC device at an on-state voltage. For this type of recovery operation, a short duty cycle, typically on the order of 10% would be appropriate.

Optionally, the SiC device is operationally located in a circuit, wherein the method further comprises removing the SiC device from the circuit, and reinstalling the SiC device in the circuit after the at least partial recovery of the forward bias drift via one of the techniques described above, or via annealing in ambient atmosphere (e.g. nitrogen or argon gas) at temperatures below 1000° C. The maximum temperature used for the recovery must be chosen appropriately to ensure the integrity of the device package and contacts are not degraded.

Figure 4:
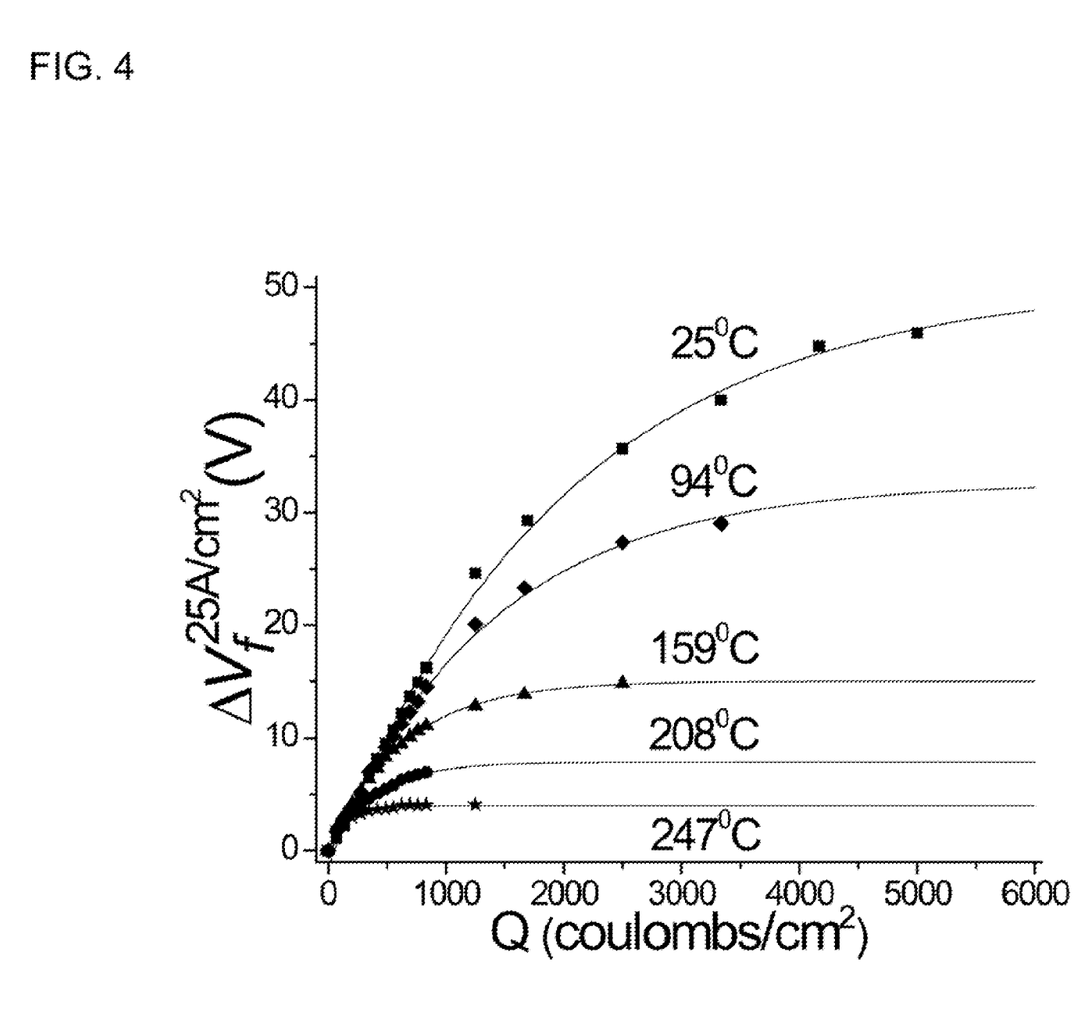
FIG. 4 is an illustrative graph of the change in the $V_f$ as a function of total injected charge during forward bias operation (stressing) at 14 A/cm$^2$ of a PIN diode at various temperatures as labeled.
Figure 5:
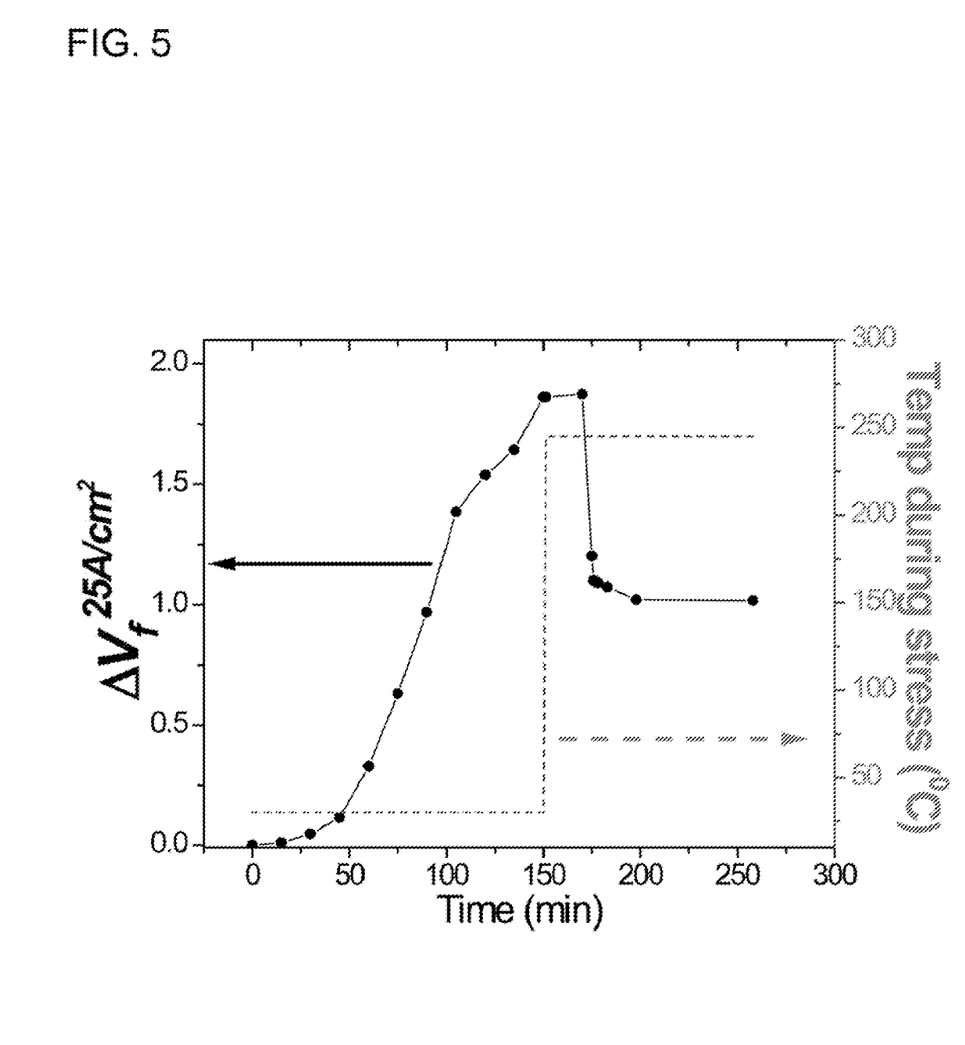
FIG. 5 is an illustrative graph of the current-induced recovery concept discussed below, using a PIN diode as an example.

This embodiment of the invention is further described by way of illustration as follows. This embodiment is intended to reverse the SSF-induced degradation following periods of device operation. This method is, for example, performed with the device still in the circuit and does not require temperatures which exceed current electronics packaging technology. In this case, the devices would be operated as desired within their designed circuit. Typically this would be expected to induce some SSF-induced degradation, which over time would cause $V_f$ drifts that would eventually render the circuit non-operational. However, when the device is not required to be operating under forward bias, the device could be heated, either through the ambient temperature of the circuits environment or due to the current-induced heating from the surrounding devices under forward-bias operation, to temperatures exceeding 150° C. At this or higher temperatures, a forward bias current would be passed through the device inducing the current-induced recovery of the $V_f$ drift. The current-induced recovery effect occurs at faster rates with higher forward-bias currents. However, the overall magnitude of the recovery is maximized by operating at reduced currents (as shown in FIGS. 4 and 5, as will be discussed further below). Therefore, an optimized regeneration process could be developed based on this method in which a device was operated for regeneration purposes at a given elevated temperature at a high initial injection current, which would then be ramped down to lower and lower currents to obtain the maximum $V_f$ drift recovery in the shortest amount of time. Optimization of this procedure for the device of interest is established on a device-specific basis. For example in a 4H—SiC PIN diode operating in an ambient with temperature T>150° C., the device during recovery is operated initially at $\frac{1}{10}^{th}$ of the on-state current, stepping the current down in decades until 4-5 decades, with the time spent at each successive step increasing. The prescribed times for each step would then be optimized based on the level of stacking fault density, device operating current, duty cycle, operating temperature and the available time in the off-state for such procedures to occur. The operating times, for example, vary from several seconds for the initial recover currents up to tens of minutes if required for the lowest of current values. This process alternatively is performed on devices within a removable and replaceable circuitry that could be regenerated (i.e., refurbished) and then reinstalled. This is possible due to the repeatable behavior of the current-induced recovery phenomenon.

Applicants determined that the consistent contraction of the SSFs to their original BPDs is also accompanied by a complete, repeatable recovery of the electrical characteristics of the device. The stressing, annealing, high temperature stressing and current-induced recovery effects are illustrated in a series of figures, with the data collected using a 4H—SiC PIN diode consisting of a ~0.5 mm thick p++ (e.g., Na>1× 1020 cm$^{-3}$), a 1-2 mm thick p+ (e.g., Na~1×1018 cm$^{-3}$) and a 100 mm thick n– (e.g., Nd~5×1014 cm$^{-3}$) drift layer grown on a >350 mm thick n+ (e.g., Nd>5×1018 cm$^{-3}$) that was patterned into a 1.1 mm×1.1 mm diode with a gridded topside contact to enable electroluminescent ("EL") imaging of the device under operation. However, consistent and similar results have been observed and reported in a large number of PIN diodes as well as in MPS diodes, vertical DMOSFETs and VJFETs, and therefore this sample should not be considered as a limiting example, but rather as a sample to illustrate the behavior discussed.

Figure 1:
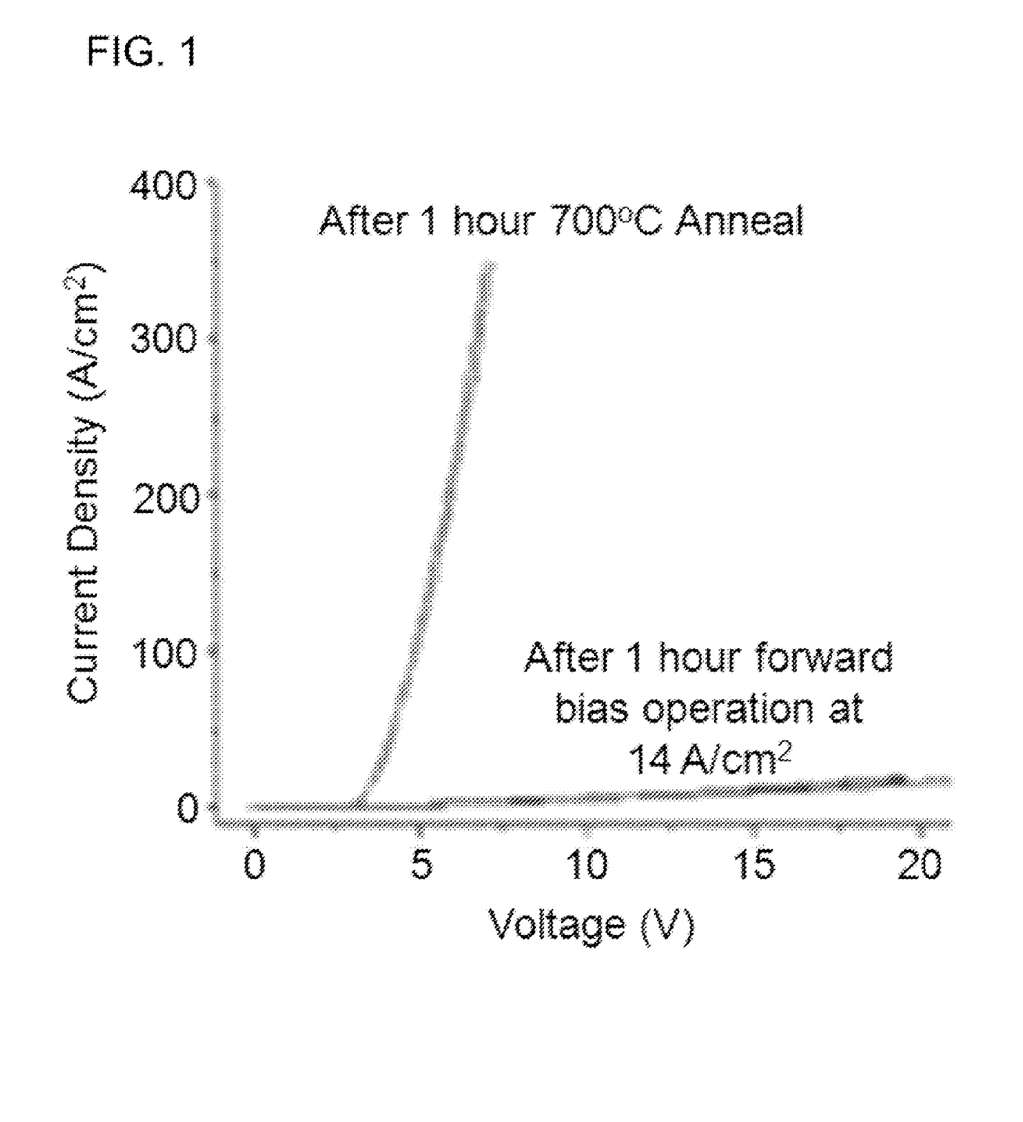
FIG. 1 is an illustrative graph of pulsed current-voltage ("IV") traces acquired following four successive periods alternating between forward bias operation of a PIN diode.

FIG. 1 is an illustrative graph of pulsed current-voltage ("IV") traces acquired following four successive periods alternating between forward bias operation of a PIN diode at 14 A/cm$^2$ for one hour and one hour of annealing of the device at 700° C. in nitrogen ambient, as labeled on the graph. The graph shows high reproducibility of the stressing and annealing behavior within the PIN diode. That is, the graph shows that the IV traces are repeatable from procedure to procedure. This implies that while the propagation of SSFs is undoubtedly detrimental to the electrical behavior of SiC PIN diodes, the impact that these defects have upon these devices is reversible and may be reversed in a repeatable, consistent manner. Furthermore, the effects that the SSFs have are consistent from one applied stress or anneal to the next, thereby implying that any lasting damage induced from such annealing and stressing procedures is negligible. This allows for the investigation of the behavior of these defects within a single device under a number of variable conditions.

Figure 2:
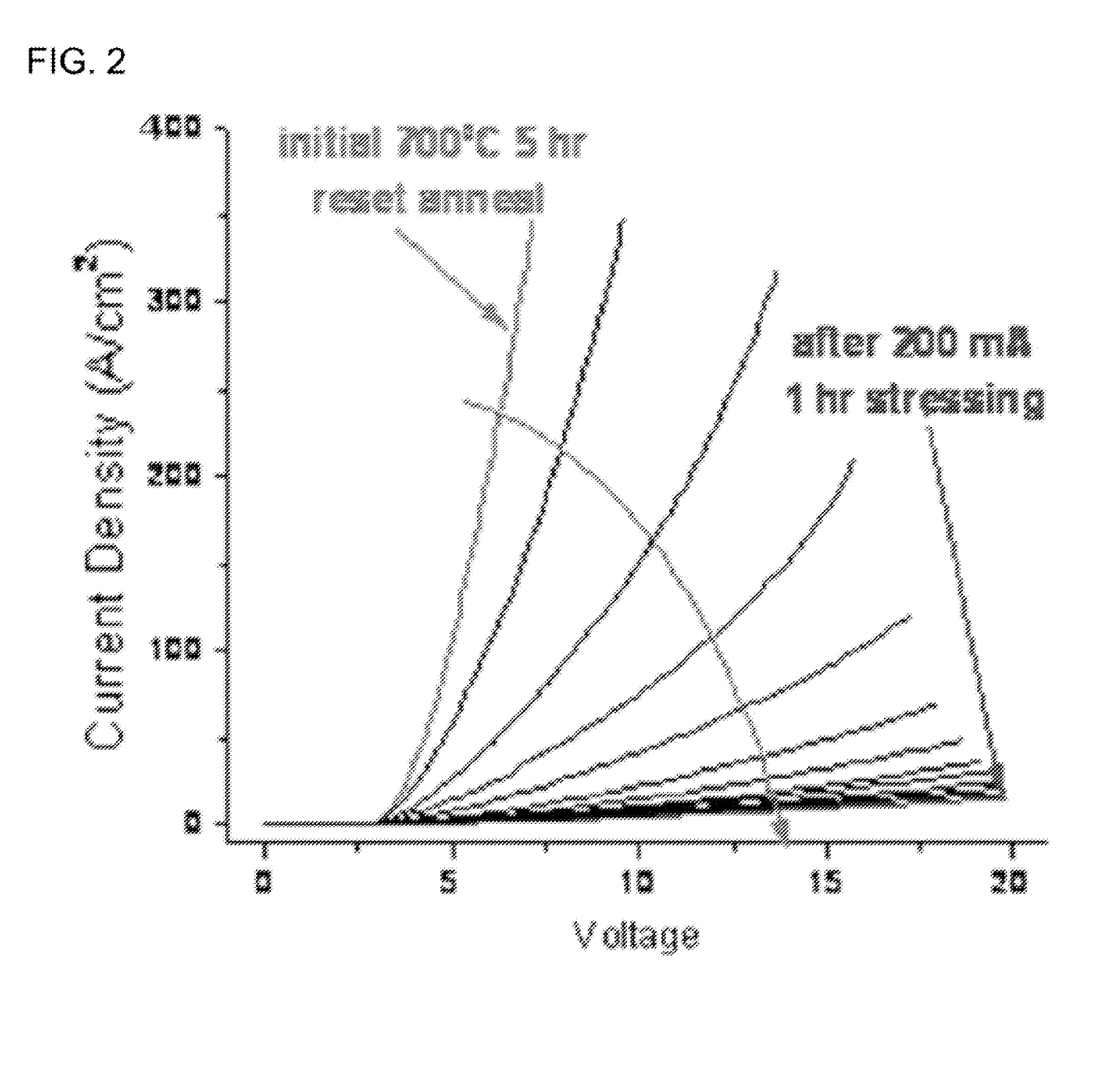
FIG. 2 is an illustrative graph of a series of pulsed IV traces acquired following successive 5 minute periods of 200 mA (14 A/cm$^2$) operation of a PIN diode.
Figure 3:
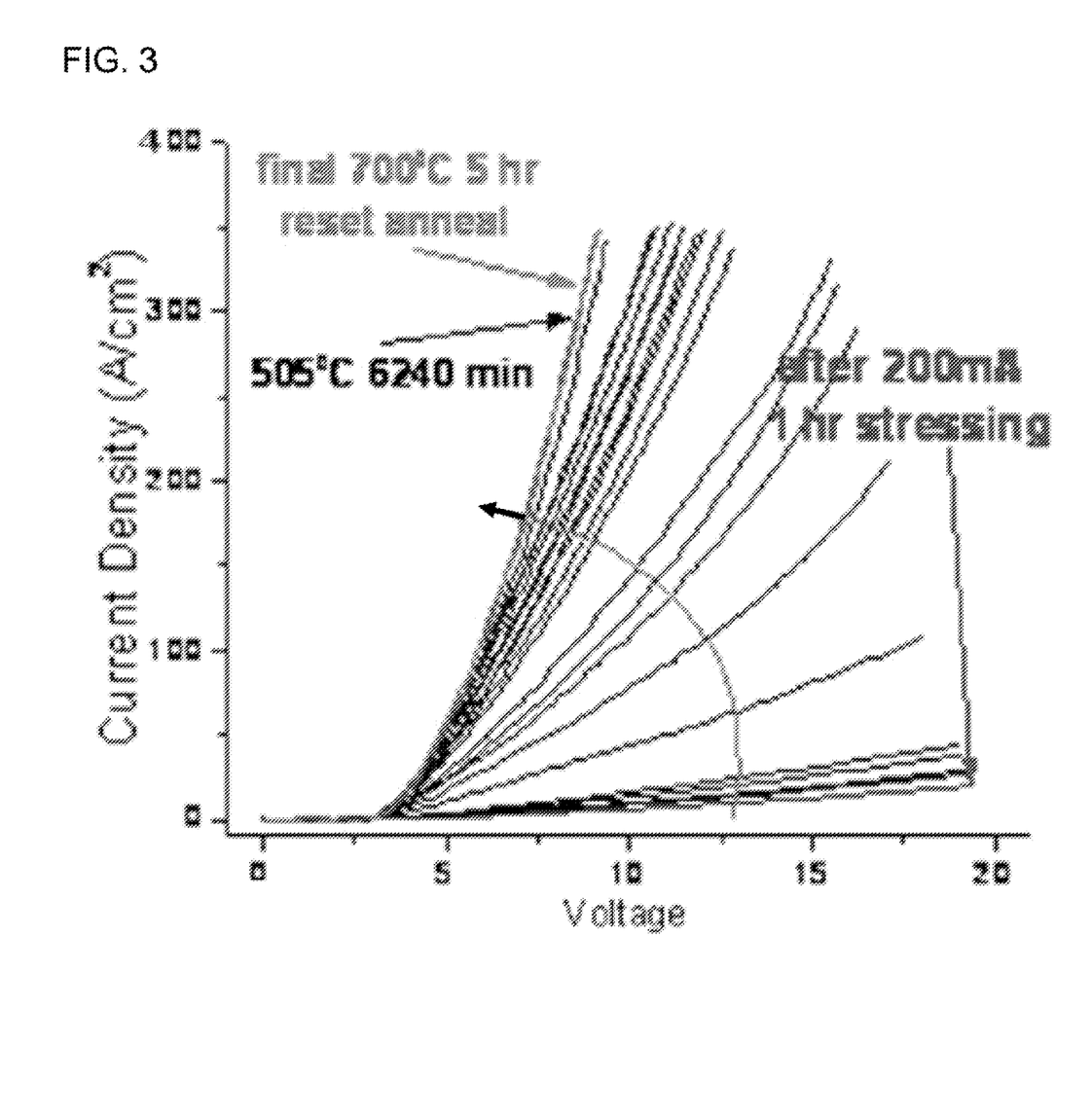
FIG. 3 is an illustrative graph of consecutive IV traces for a PIN diode taken following subsequent annealing periods at 505° C. in nitrogen atmosphere for a succession of intervals at various times.

FIG. 2 is an illustrative graph of a series of pulsed IV traces acquired following, for example, successive 5 minute periods of 200 mA (14 A/cm$^2$) operation of a PIN diode. The curved arrow pointing downward and rightward indicates the direction of the $V_f$ drift with increasing forward bias operation time. The initial and final curves are labeled as "initial 700° C. 5 hr reset anneal" and "after 200 mA 1 hr stressing," respectively. FIG. 3 is an illustrative graph of consecutive IV traces taken following subsequent annealing periods, for example, at 505° C. in nitrogen atmosphere for a succession of intervals at various times. The annealing times, starting from the initial trace at the bottom of the graph (labeled "after 200 mA 1 hr stressing", were, for example, 0, 5, 5, 7.5, 7.5, 10, 10, 10, 10, 15, 15, 15, 20, 40, 60, 250, 480, 960, and 4320 minutes, respectively. The final IV curve at the end of these annealing procedures, for example, at 505° C. (labeled as "final 700° C. 5 hour reset anneal") shows the completion of the recovery of the $V_f$ drift. The arrow curving upward and leftward denotes the direction of the $V_f$ drift recovery with increasing annealing time. FIGS. 2 and 3 show a series of IV traces taken during intermediate steps of, for example, a 1 hour, 14 A/cm$^2$ stressing procedure and, for example, a 104 hour, 505° C. anneal, respectively. Each IV trace collected during the stressing was taken following, for example, a 5 minute stress interval. An EL image was also collected at each of these steps to mark the progress of the SSF expansion (not shown). In the case of the annealing procedure, the steps were not equidistant, but were progressively lengthened as the annealing was continued and the contraction process slowed. In an alternative embodiment of the invention, the steps are performed at regular intervals, that is, equidistant in time as the annealing continues.

Presented in FIG. 4 are successive $\Delta V_f$ versus Q traces from an illustrative diode, with $\Delta V_f$ representing the change in the $V_f$ from the initial, unfaulted state of the diode and Q representing the total injected charge density (product of the stressing time and injection current density), as a function of the electrical stressing temperature. $\Delta V_f$ was monitored at, for example, 10, 25, 50, 75, 100 and 150 A/cm$^2$ along the successive IV traces providing similar qualitative results, with the results collected at, for example, 25 A/cm$^2$ shown in FIG. 4. The stressing procedure was then repeated with this cycle being continued until no further changes in $\Delta V_f$ were observed. A 'reset' anneal, which is defined as an anneal inducing a complete recovery of the diode (e.g., 700° C. for 5 hours), was then performed and the stressing process was repeated at a different stressing temperature. Least squares fitting of the $\Delta V_f$ vs. Q traces were then completed using the following equation:

$$\Delta V_f(T) = \Delta V_f^{sat}(T) + A_1 e^{-Q/Q^{sat}(T)} \quad (1)$$

where $A_1$ is an exponential prefactor and $Q^{sat}(T)$ is the total charge required to reach $\Delta V_f^{sat}$ at a given temperature. It is clear from FIG. 4 that $\Delta V_f^{sat}$ decreases almost linearly with increasing stressing temperature, with the superscript 'sat' denoting the maximum change in the forward voltage that is observed at the 'saturation' condition.

Another embodiment of the invention comprises, for example, a method of inhibiting Shockley stacking fault expansion. The method comprises operating one of a bipolar or a unipolar SiC device such that an on-state is shorter than an off-state for the SiC device. The SiC device is heated to a temperature above 150° C. and below the maximum operational temperature of the SiC device. A forward bias current is passed via forward bias operation through the SiC device sufficient to inhibit forward bias drift, thereby maintaining the SiC device within an operational performance specification thereof.

This embodiment of the invention is further described by way of illustration as follows. Operation of SiC devices at elevated temperatures has been shown to reduce the rate of SSF expansion (i.e., the rate of $V_f$ drift) and greatly limit the maximum device volume affected by the size of the SSFs, which in turn limits the maximum forward voltage drift of the device. Device operation at temperatures exceeding 150° C. led to, for example, a 70% reduction in the maximum $V_f$ drift, while operation at 245° C. led to, for example, a 90% reduction, in comparison to the degradation induced due to device operation at room temperature and the same forward bias current density. This effect is presented in FIG. 4, an illustrative graph of the change in the $V_f$ as a function of total injected charge during forward bias operation (stressing) at, for example, 14 A/cm$^2$ of the same PIN diode at various temperatures as labeled. Following each stressing procedure, for example, a 10 hour, 700° C. anneal in nitrogen atmosphere was performed to completely anneal the SSFs and fully recover the $V_f$ drift. The lines are exponential fits to the five data sets. The graph in FIG. 4 shows a 10× reduction in the maximum $V_f$ drift induced when the device is operated, for example, at 247° C. in comparison to when it was operated, for example, at 25° C. This benefit was illustrated in an oral presentation and proceedings publication by Kansai Electric Power Inc. at the 2007 International Conference on Silicon Carbide and Related Materials in Otsu, Japan. The proceedings publication, Nakayama, et al., Behavior of Stacking Faults in TEDREC Phenomena for 4.5 kV SiCGT, Materials Science Forum 600-603, 1175 (2009), is incorporated herein by reference. In the oral presentation and the proceedings publication, Kansai Electric Power showed that a 184 kVA, 4.5 kV SiCGT inverter based on SiC bipolar devices was operated at 150° C. following forward-bias degradation due to SSF formation and exhibited no detrimental impact on the electrical characteristics of the inverter's operation. In comparison, this degradation was observed at room temperature where significant drift in $V_f$ had occurred in the devices making up the same inverter, thereby inducing significant reductions in the performance of the inverter.

FIG. 5 is an illustrative graph of the current-induced recovery phenomenon discussed below, using a PIN diode as an example. A PIN diode was initially operated with an injection of, for example, 14 A/cm² for an extended period at 30° C., with pulsed IV measurements being recorded at various intervals. The change in $V_f$ at, for example, 25 A/cm² (left axis, solid circles) along each of the subsequent pulsed IV measurements constitutes one point. The device was operated under these conditions until point 'b' was reached, which was close to $V_f$ drift saturation. The device was then heated, for example, to 245° C. in the off state for 20 minutes and then cooled, for example, to 30° C. and the IV curve was measured again. As shown, no noticeable change in the $V_f$ drift was observed. The device was then heated back, for example, to 245° C. and the 14 A/cm² injection was reinitiated. Five successive stressing procedures under these conditions were carried out, with a cool down, for example, to 30° C. for an IV measurement being performed after each stressing period. (Depending on the application, more or fewer successive procedures may be advantageously carried out). Under these conditions, a partial recovery of the $V_f$ drift was observed, with the maximum recovery for these conditions being observed at point 'c'. For example, a 50% recovery of the $V_f$ drift was observed under these conditions. Larger recoveries are observable for higher temperature operation or lower injection currents. The solid line is a guide to the eye. The temperature at which the forward bias operation was carried out is denoted by the dashed line and the right axis. All IV measurements were monitored, for example, at 30° C.

That is, to explain the current-induced recovery phenomenon, FIG. 5 shows an illustrative continuous graph or plot of $\Delta V_f$, as measured at 25 A/cm² along each of the subsequent IV curves, as a function of stressing time, at various stressing temperatures in another illustrative diode. In the plot, current of 14 A/cm² was injected into the diode at 30° C. until $\Delta V_f^{sat}$ was approached following a full 'reset' anneal. However, following this set of measurements, the thermal chuck was then heated to 245° C. and was allowed to sit at temperature for a 20 minute period. As evidenced by the lack of recovery between 150 and 170 minutes, during which time no current was injected, the increase in temperature alone was insufficient for inducing any observable recovery of the $V_f$ drift. Following this, 14 A/cm² was injected into the diode at 245° C. A partial recovery of the $V_f$ drift was then observed. It is clear that this recovery is dependent not only upon the temperature increase, but also upon the presence of injected ehps, which serve to reduce the activation barrier associated with the SSFs expansion/contraction. Applicants determined that in the presence of ehp injection that SSFs may be both expanded or contracted. Applicants determined that the expansion/contraction process is governed by the interplay between a number of factors, including the stressing current density, the stressing temperature, the total volume of the diode active area affected by SSFs and the position of the SSF leading partial dislocation within the drift region in comparison to the injected ehp density profile. By taking measurements of these factors, appropriate parameters can be determined as to where SSF contraction, and therefore recovery of the electrical characteristics of the devices, may occur.

Figure 6A:
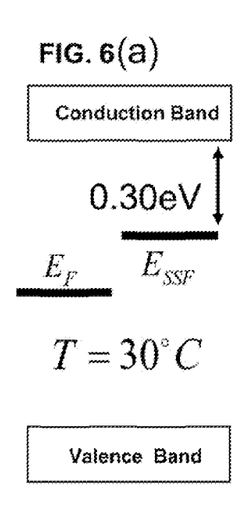

Applicants theorize why the above-mentioned embodiments of the invention at least partially recover or inhibit SSFs in a SiC device as follows, with reference to FIGS. 6(a)-(f). FIGS. 6(a)-(f) are step-by-step schematic energy diagrams describing how the current-induced recovery phenomenon discussed above with respect to FIG. 5 occurs. FIG. 6(a) shows an energy diagram of a device at thermal equilibrium. Fermi Energy ($E_F$) lies deeper within the band gap between the valence and conduction bands than the minimum of the split off band associated with the SSFs ($E_{SSF}$). At thermal equilibrium, as shown in FIG. 6(a), SSFs are unfavorable as the Fermi energy ($E_F$) of carriers within the drift region is well below the bottom of the SSF split-off band (e.g., $E_{SSF}=E_{CBM}-0.3$ eV, where $E_{SSF}$ and $E_{CBM}$ are the energy of the SSF split-off band and the energy of the conduction band minimum). This, in addition to the large activation energy for SSF expansion in the absence of an applied bias, ensures that spontaneous SSF nucleation/expansion at room temperature does not occur.

Figure 6B:
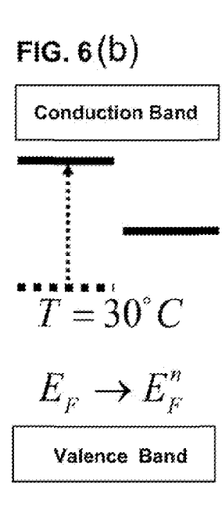

FIG. 6(b) shows an energy diagram of a forward bias being applied to the SiC device. A Fermi energy is not a valid description of carrier dynamics when not at equilibrium. Therefore, the Fermi energy will hence forth be referred to by the proper quasi-electronic Fermi energy ($E_F^n$). The application of sufficient bias leads to an increase in $E_F^n$ to a level above $E_{SSF}$. However, once a bias is applied, as shown in FIG. 6(b), ehps are injected into the drift region, allowing the recombination-enhanced dislocation glide ("REDG") effect to occur, thereby providing a pathway for SSF motion exhibiting an activation barrier that is reduced ten-fold.

Figure 6C:
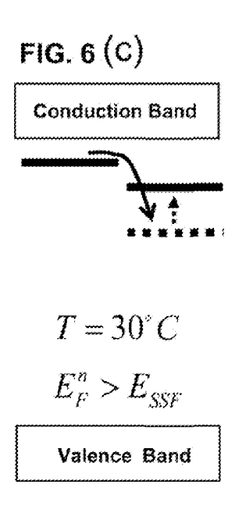

FIG. 6(c) shows an energy diagram, wherein once this quasi-electronic Fermi energy level condition is met, conduction electrons can readily fill the SSF split off band, thereby raising the energy of the SSFs relative to $E_F^n$. The current injection further increases the chemical potential of the conduction electrons above the SSF split-off band minimum, therefore allowing electrons to become trapped and then recombine within the SSF, thereby causing SSF creation and expansion to be conditionally favorable, as shown in FIG. 6(c).

Figure 6D:
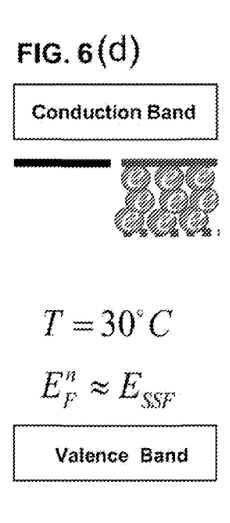

FIG. 6(d) shows an energy diagram, wherein following extended periods of forward bias operation, eventually a steady-state condition is met when $E_F^n \sim E_{SSF}$ and a saturation in the $V_f$ drift is observed and no significant SSF expansion occurs under these conditions. Further injection causes the split-off band population to increase, until eventually a steady-state between the filling of the split-off band and the chemical potential of the conduction electrons is attained, as shown in FIG. 6(d). Once the bias is removed, the large activation energy associated with SSF movement is reestablished, ensuring that SSF contraction does not occur, despite the lattice strain associated with the SSF incorporation within the 4H—SiC lattice. However, the increased temperatures associated with annealing increase the probability of overcoming this activation energy, thereby allowing SSF contraction to occur on a relatively slow time scale (e.g., hours to days for full recovery), with full recovery of certain heavily degraded diodes occurring within 20 minutes at 700° C. The recovery occurs in a shorter period of time at higher temperatures or in less degraded devices.

Figure 6E:
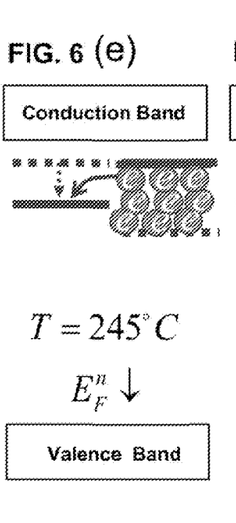

FIG. 6(e) shows an energy diagram, wherein the device is then heated to a higher temperature and/or the injection current is reduced, $E_F''$ is lowered and the steady-state is no longer valid. That is, at the steady-state condition ($\Delta V_f^{sat}$) shown in FIG. 6(d), an increase in the temperature during current injection would reduce the chemical potential of the conduction electrons, as indicated by the dashed arrow proceeding from the dashed line to the solid line in FIG. 6(e), thereby perturbing the steady-state.

Figure 6F:
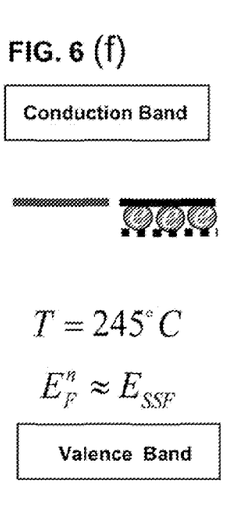

To reestablish the steady-state, depopulation of the SSF split off band occurs until FIG. 6(f), which shows an energy diagram, wherein $E_F'' \sim E_{SSF}$ is again reached under the new operating conditions. This new steady-state condition will necessarily have led to a reduction in the volume of SSFs and therefore in the magnitude of the forward voltage drift. That is, in order to reestablish a steady-state, SSF contraction would occur, depopulating the SSFs and reducing its density of states until a new steady-state condition was established, as shown in FIG. 6(f). Similarly, reductions (or increases) in the injection current would lead to decreases (or increases) in the chemical potential as well, and therefore would induce a larger (or smaller) current-induced recovery of the $V_f$ drift at a given elevated temperature.

Obviously, many modifications and variations of the present invention are possible in light of the above teachings without departing from the true scope and spirit of the invention. It is therefore to be understood that the scope of the invention should be determined by referring to the following appended claims.

What is claimed is:

1. A method of reversing Shockley stacking fault expansion comprising:
    providing one of a bipolar and a unipolar SiC device exhibiting forward voltage drift degradation induced by Shockley stacking fault nucleation and expansion;
    heating the SiC device to a temperature above 150° C.;
    passing a forward bias current via forward bias operation through the SiC device sufficient to induce at least a partial recovery of the forward bias drift.

2. The method according to claim 1, wherein the SiC device comprises one of a hexagonal SiC bipolar device and a hexagonal SiC unipolar device, wherein bipolar injection occurs during operation thereof.

3. The method according to claim 2, wherein the SiC device comprises one of a PIN diode, bipolar junction transistor, a junction barrier Schottky diode, a merged-PIN-Schottky diode, a vertical junction field effect transistor, a vertical diffused metal-oxide-semiconductor field-effect transistor, and an insulated gate bipolar transistor.

4. The method according to claim 1, wherein the forward bias current is between 1 and 24 mA/cm$^2$.

5. The method according to claim 1, further comprising:
    operating the SiC device at an on-state voltage, turning the SiC device off at a positive, off-state voltage, the off-state voltage being lower than the on-state voltage, and returning to said operating the SiC device at an on-state voltage.

6. The method according to claim 1, wherein the SiC device is operationally located in a circuit, wherein the method further comprises:
    removing the SiC device from the circuit, and reinstalling the SiC device in the circuit after the at least partial recovery of the forward bias drift.

7. A method of inhibiting Shockley stacking fault expansion comprising:
    operating one of a bipolar and a unipolar SiC device such that an on-state is shorter than an off-state for the SiC device;
    heating or operating the SiC device at a temperature above 150° C.;
    passing a forward bias current through the SiC device in the off-state sufficient to one of reverse and inhibit the forward bias drift, thereby maintaining the SiC device within an operational performance specification thereof.

* * * * *